United States Patent [19]

Okubora et al.

[11] Patent Number: 5,357,122
[45] Date of Patent: Oct. 18, 1994

[54] THREE-DIMENSIONAL OPTICAL-ELECTRONIC INTEGRATED CIRCUIT DEVICE WITH RAISED SECTIONS

[75] Inventors: Akihiko Okubora; Chiaki Takano; Kiyoshi Tanaka; Hideto Ishikawa, all of Kanagawa, Japan

[73] Assignee: Sony Corporation, Tokyo, Japan

[21] Appl. No.: 939,694

[22] Filed: Sep. 2, 1992

[30] Foreign Application Priority Data

Sep. 5, 1991 [JP] Japan ................... 3-252758
Sep. 6, 1991 [JP] Japan ................... 3-254258

[51] Int. Cl.$^5$ ........................... H01L 27/14
[52] U.S. Cl. ........................... 257/84; 257/85; 257/98; 257/432; 257/466; 385/14; 372/48
[58] Field of Search ........... 257/84, 85, 80, 81, 257/82, 83, 98, 432, 466, 95, 466; 385/14, 8; 372/50, 48

[56] References Cited

U.S. PATENT DOCUMENTS

| | | | |
|---|---|---|---|
| 3,229,104 | 1/1966 | Rutz ........................... | 257/84 |
| 4,873,429 | 10/1989 | Kume et al. ................ | 257/82 X |
| 4,933,561 | 6/1990 | Göransson et al. ........ | 257/83 X |
| 4,970,381 | 11/1990 | Huang et al. .............. | 257/80 X |
| 5,111,467 | 5/1992 | Bradley ..................... | 372/50 X |
| 5,198,684 | 3/1993 | Sudo ......................... | 257/82 X |
| 5,200,631 | 4/1993 | Austin et al. ............. | 257/81 |

FOREIGN PATENT DOCUMENTS 63-16435 1/1988 Japan .
2214609 8/1990 Japan .

Primary Examiner—William Mintel
Attorney, Agent, or Firm—Hill, Steadman & Simpson

[57] ABSTRACT

An optical-electronic integrated circuit device capable of three-dimensionally transmitting optical signals between plural semiconductor substrates on each of which an integrated circuit is previously formed. At least one of the light emitting elements and the light receiving elements are formed on the semiconductor substrate which transmits the light propagated between these elements. In this manner, signals may be transmitted in a direction perpendicular to the semiconductor substrate even without specifically processing the semiconductor substrate. Additionally, signal distortion, transmission losses, mutual intervention or delay are not incurred. For two-dimensionally connecting plural three-dimensionally integrated optical-electronic integrated circuit devices in a direction parallel to the semiconductor substrates, the circuit devices are arrayed on an optical interconnection base plate, and light signals are transmitted by means of a pair of inclined surfaces which are formed on the optical interconnection base plate and which are arranged facing the light emitting element and the light receiving element, and the light waveguide channels defined between these inclined surfaces. This drastically increases the operating speed of the circuit device and the integration degree.

6 Claims, 14 Drawing Sheets

ABSORPTION COEFFICIENTS AND END OF
ABSORPTION OF VARIOUS SEMICONDUCTOR CRYSTAL

MSM TYPE PHOTO DETECTOR

EXAMPLE OF DRIVING CIRCUIT OF LIGHT-RECEIVING ELEMENT

EXAMPLE OF DRIVING CIRCUIT OF LIGHT-EMITTING ELEMENT

THREE-DIMENSIONAL OPTICAL-ELECTRONIC INTEGRATED CIRCUIT DEVICE WITH RAISED SECTIONS

BACKGROUND OF THE INVENTION

This invention relates to an optical-electronic integrated circuit device in which plural optical-electronic integrated circuit substrates, each provided with an electronic circuit, a light emitting element and a light receiving element, are optically coupled in a direction parallel to the substrates. More particularly, it relates to an optical electronic integrated circuit device in which the substrates are stacked three-dimensionally in a direction perpendicular to the substrates for improving the integration degree of the circuit device.

The present tendency is towards a higher integration and a higher operating speed of LSIs (Large Scale Integrated circuits) and ICs employing semiconductors, such as silicon, and compound semiconductors, such as GaAs. In a system such as a work station or a personal computer employing such electronic devices, a demand for a smaller size and a higher operating speed will become more acute in the future, In LSIs employing the current semiconductor integrated circuits, the interconnection between microsized devices formed on a circuit chip is a patterned electrical interconnection of a metal or like material. However, as long as such an electrical interconnection is employed, the problem of delay in transmission is raised when operating at an ultra-high operating speed if an extremely fine pattern of interconnection is used, while the problem of induction noise or mutual interference is raised if the space between interconnections is reduced as the result of increasing the packaging density.

Meanwhile, such problem resulting from ultra high speed or from high density is not present in an optical integrated circuit in which signals are transmitted by light. That is, ultra high operating speeds may be easily achieved in optical-electronic integrated circuits since stray capacitance or inductances between the interconnections are reduced. For time multiplexed transmission, lower power consumption may also be achieved by employing the optical-electronic integrated circuit. For this reason, attention has been directed to transmission of signals between electronic devices by light coupling without relying upon electrical interconnection.

As an example of an apparatus for two-dimensionally accomplishing such light coupling, there is disclosed in JP Patent KOKAI Publication No. 61-121014 (1986) an apparatus which a light interconnecting plate 515 consisting of e.g. an SiO₂ substrate is mounted on a substrate 511 on which a light receiving element Pd and a light emitting element Em are formed, and in which a vee-shaped groove 516 and a high refractive index light guide channel 517 formed by proton radiation on the substrate, as shown in FIG. 1 . The light emitted from the light emitting element reaches a lateral surface of the vee-shaped groove provided in the light interconnection plate. Since the upper part of the light interconnecting plate is covered with a low refractive index substance, such as air, the light may undergo total reflection on the lateral surface of the vee-shaped groove and thence is guided to the light wave guide channel by setting the angle of the lateral surface of the vee-shaped groove to a value not more than the critical angle determined by the refractive index of SiO₂ with respect to air. The light incident on the light wave guide channel is transmitted through the light wave guide channel toward another vee-shaped groove to wherein undergoes total reflection at the lateral surface of the vee-shaped groove to reach the light-receiving element.

However, with the above-described two-dimensional light coupling, the operating speed and the packaging density of the circuit cannot be raised beyond certain limit values. An effective measure for realizing both high operating speed and high density packaging is by three-dimensional integration which provides for integrating the optical-electronic integrated circuit board in a direction perpendicular to the major surface of the circuit board.

However, for signal transmission by light between three-dimensionally arrayed substrates, it is necessary to provide light receiving elements and light emitting elements on both sides of the substrate or to bore throughholes in the substrate for forming light transmission paths. The process for achieving this is highly complex and is not suited to practical application. As a possible solution to this problem, there is also known an example of effecting light transmission by penetration through the substrate. For example, IEEE JOURNAL OF SOLID-STATE CIRCUITS, VOL. 25, No. 1, FEBRUARY 1990 discloses signal transmission between three-dimensional memories by light coupling at an ordinary wavelength. However, since light transmitted through the substrate is not used with this technique, it is necessary to reduce the thickness of the silicon layer by polishing or like processing operations to an order of 0.5 μm to diminish light losses during penetration of light signals through the silicon substrate.

OBJECT AND SUMMARY OF THE INVENTION

In view of the above-described state of the art, it is a primary object of the present invention to provide, in connection with an optical-electronic integrated circuit device in which plural substrates are interconnected by light coupling, a three-dimensional optical-electronic integrated circuit device capable of transmitting light signals in a direction perpendicular to the substrate without requiring special processing of the substrate.

It is a second object of the present invention to provide a three-dimensionally integrated optical-electronic integrated circuit device in which light transmission may be additionally made in a direction parallel to the substrate.

For accomplishing the above an other objects of the preset invention, the three-dimensional optical-electronic integrated circuit device according to the present invention is characterized in that a plurality of semiconductor substrates, on each of which an optical electronic integrated circuit has previously been formed, are stacked in a direction perpendicular to the major surface of the semiconductor substrate, and in that signal transmission between the semiconductor substrates is effected by light signals transmitted through the semiconductor substrates.

According to the present invention, the semiconductor substrates may be single crystal silicon substrates or compound semiconductor substrates. The semiconductor substrates may also be hybrid structure in which a compound semiconductor substrate is connected to a part of the silicon substrate, in which case the light receiving element and the light emitting element may be formed on the compound semiconductor substrate.

The light signals transmitted through the semiconductor substrates are emitted by a light emitting element of an optical-electronic integrated circuit of one of the semiconductor substrates and received by a light receiving element of the other optical-electronic integrated circuit. The wavelength of the light emitted by the light emitting element is preferably longer than the absorption limit that at the receiving end of the substrate material. Besides, the light receiving element needs to be sensitive to the light of such wavelength.

In FIG. 2, showing the wavelength dependency of the absorption coefficients of certain semiconductor substrate materials, the light wavelength is plotted on the abscissa and the absorption coefficient is plotted on the ordinate. If GaAs, a compound semiconductor, for example, is used as a substrate material, the end point of absorption is at the wavelength slightly larger than 0.85 $\mu m$. If signal transmission are carried out with light of a wavelength longer than the end point of absorption of GaAs, light absorption by the GaAs substrate scarcely occurs so that it becomes possible to transmit the light through the substrate. On the other hand, a silicon substrate has an end point of absorption at a wavelength slightly beyond 1.1 $\mu m$, so that light transmission without absorption by the silicon substrate becomes possible by carrying out light transmission only with light of a wavelength longer than the wavelength corresponding to the end of absorption.

If the optical-electronic integrated circuit is formed of a compound semiconductor substrate, it is crucial to select light emitting elements or light receiving elements suited to the substrate. Among the light emitting elements emitting the light of a wavelength effectively transmitted through the substrate, there are an InGaAs distortion quantum well laser and an InGaAsP long-wavelength laser, if a GaAs substrate or an InP substrate is employed. On the other hand, the light receiving element receiving the light of the wavelength transmitted through the substrate may be an element having a layer of InGaAs based material as a light absorbing layer.

In the above-described arrangement, since the signal transmission between the substrates may be effected by light signals transmitted through the semiconductor substrates, signal distortion, transmission losses, mutual intervention or transmission delay may be eliminated. Besides, there is no necessity for special processing of the substrates, and the degree of freedom in selecting the positions of the light emitting elements or light receiving elements is also increased. Signal transmission through plural substrates becomes possible by light signals transmitted therethrough to contribute to increased operating speed of the three-dimensional optical-electronic integrated circuit device. The operating speed may be increased with respect to the entire system by applying the above arrangement to those portions of the circuit which are in need of higher operating speed.

For accomplishing the above-mentioned second object, the present invention provides an optical-electronic integrated circuit device comprising, in addition to the above-mentioned optical-electronic integrated circuit substrate provided with the electronic circuit light emitting element and a light receiving element, an optical interconnection base plate having an inclined region facing the light emitting element and the light receiving element, a light waveguide channel continuous to the inclined region and a reflective film deposited on the inclined region for reflecting the light used for light coupling between the optical-electronic integrated circuit substrates.

The optical interconnection base plate is a substrate provided with the above-mentioned inclined region and the light waveguide channels. If the light emitting or light receiving directions of the light emitting and light receiving elements are set so as to be perpendicular to the substrate surface and the inclined regions on the optical interconnection base plate are inclined at 45° relative to the substrate surface, the light waveguide channels may be disposed in an in-plane direction of the substrate. The optical interconnection base plate may be formed by, for example, a silicon chip without any limiting sense.

The inclined surface is coated with a metal film as a reflective film for reflecting the light of a wavelength transmitted through the substrate. The reflective film, adapted for reflecting the light used for light coupling, may be rendered electrically conductive so as to be used as the interconnection. If the reflective film is used simultaneously as the interconnection, part of the reflective film coated on the overall chip surface may be patterned in the electronic circuitry or other regions so as to be used for interconnections, such as power source lines.

With the above-described arrangement, the semiconductor substrates may be optically coupled in the two-dimensional direction to contribute to higher integration of the three-dimensional optical integrated circuit device. The light of the wavelength transmitted through the substrates may be subjected to total reflection by the reflective film provided on the inclined surface on the optical interconnection base plate. The reflective film, thus rendered electrically conductive, may simultaneously be used as the interconnection, so that a new interconnection for supplying the electric power to the optical-electronic integrated circuit may be eliminated. Since part of the transmission channel is the substrate itself, and transmission is effected through the waveguide channels coated with the reflective film, the problem of transmission losses, such as are presented in optical fibers, is not presented, so that lower laser output may be required, while the transmission channels for light coupling may be diminished by e.g. time multiplexing to achieve low power consumption.

BRIEF DESCRIPTION OF THE DRAWINGS

FIG. 2 is a schematic exploded perspective view of a three-dimensional light electron integrated circuit device according to a first embodiment of the present invention.

DESCRIPTION OF THE PREFERRED EMBODIMENTS

Figure 1:
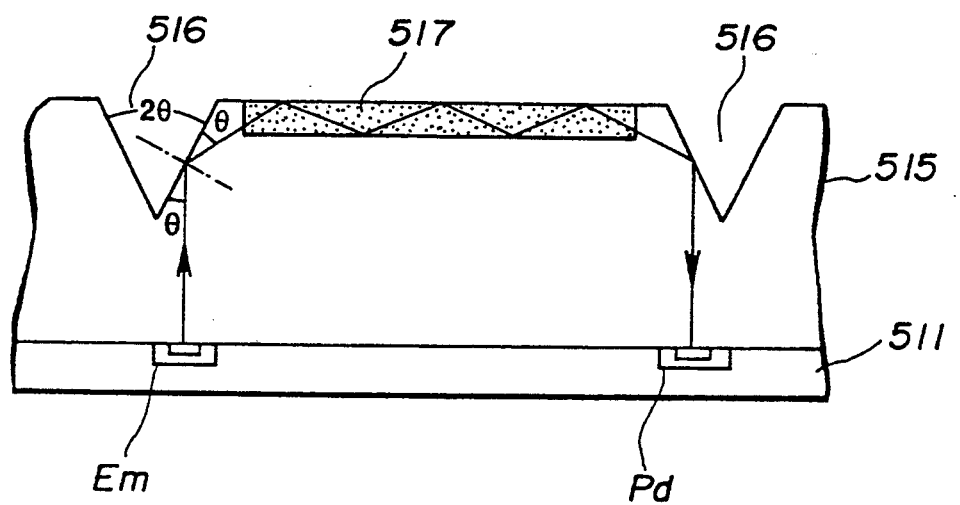
FIG. 1 is a schematic cross-sectional view showing a light-coupling portion of a conventional light electrical integrated circuit adapted for transmitting signals between electrical devices by light coupling.
Figure 2:
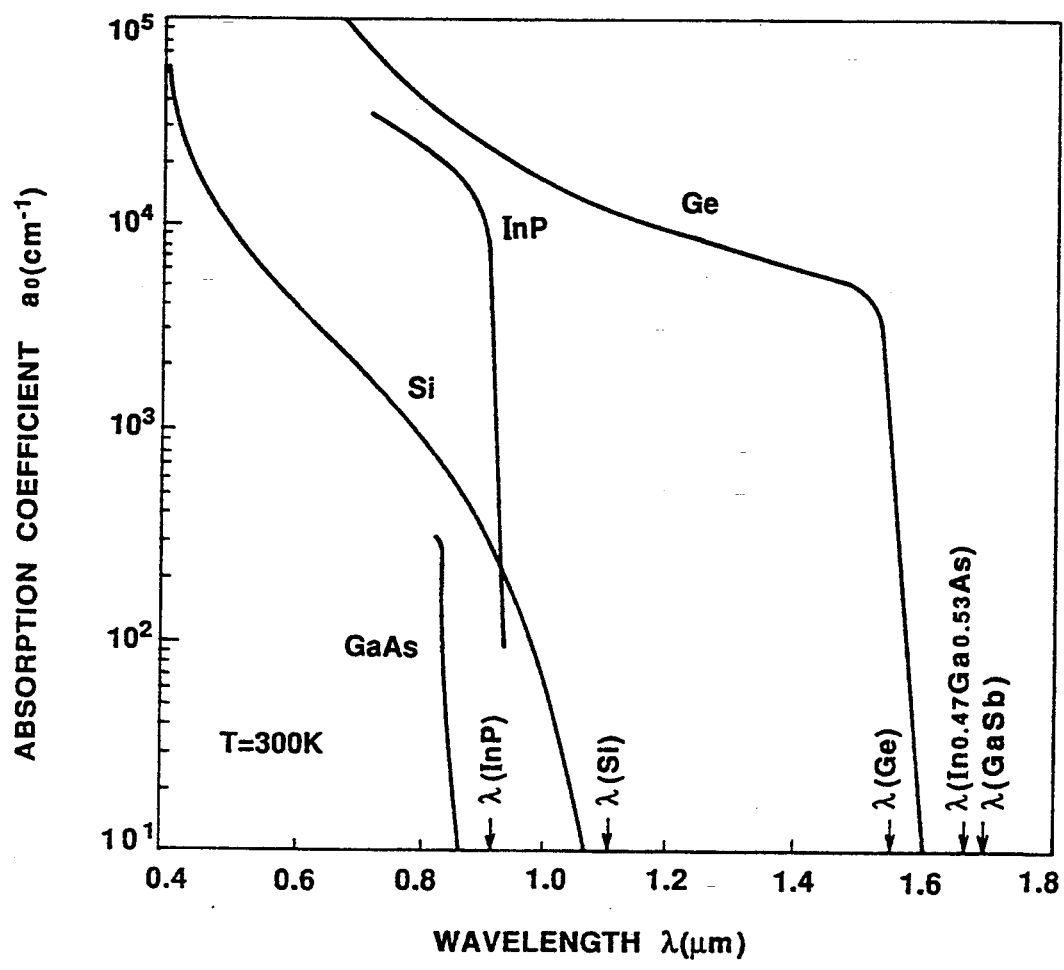
FIG. 2 is a graph showing wavelength dependency of absorption coefficients of certain semiconductor crystals.

Referring to the drawings, certain preferred embodiments of the present invention will be explained in detail.

First Embodiment

Figure 3:
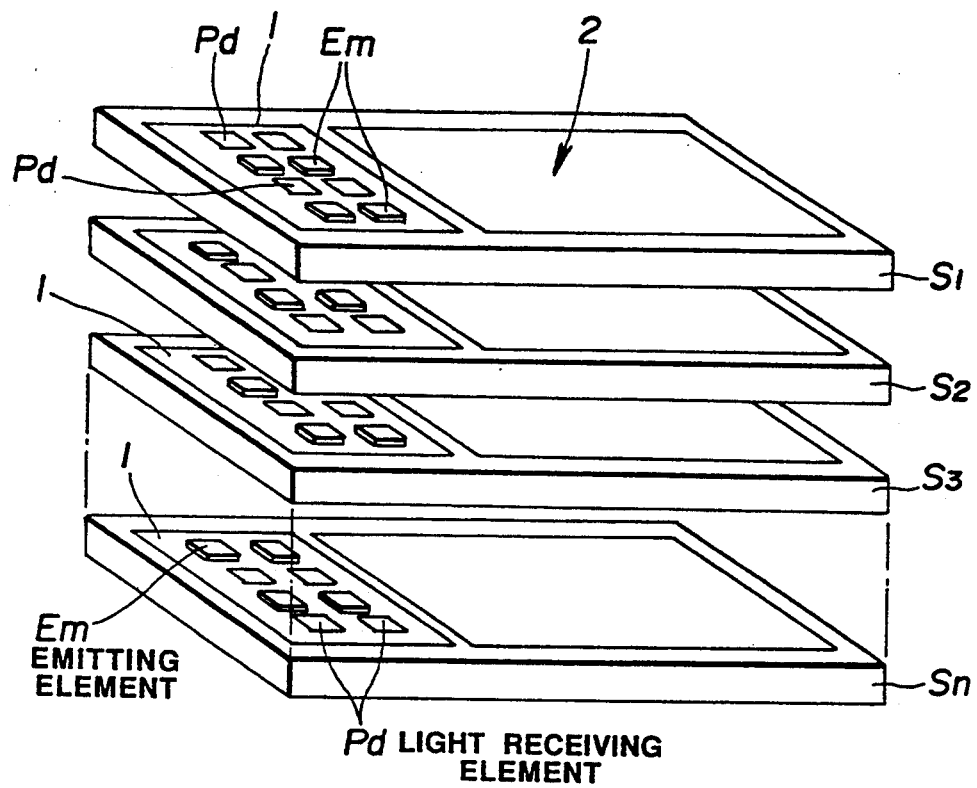

The present embodiment is a basic embodiment of the three-dimensional optical-electronic integrated circuit device of the present invention, and has a three-dimensional structure shown in FIG. 3.

Referring to FIG. 3, the three-dimensional optical-electronic integrated circuit device of the present embodiment is made up of an n number of substrates $S_1$ to $S_n$ stacked together. The adjacent substrates are sealed to each other with the interposition of a void or a material capable of transmitting optical signals. The substrates $S_1$ to $S_n$ are compound semiconductor substrates, such as a GaAs substrate or an InP substrate. The substrates $S_1$ to $S_n$ may each be formed of a single material or different materials and stacked one on the other alternately or sequentially.

In a region I of each of the substrates $S_1$ to $S_n$, light emitting elements Em and light receiving elements Pd, used for light coupling, are arrayed. The remaining region of each of the substrates $S_1$ to $S_n$ is a region for driving circuitry for the elements Em and Pd, or for signal processing circuitry or memory. The region for light coupling I is formed at a position such that, when plural substrates are stacked one on the other, the regions I are aligned in the stacking direction of the substrates, so that the light transmission channel of the light signals for light coupling is perpendicular to the major surfaces of the substrates.

Figure 4:
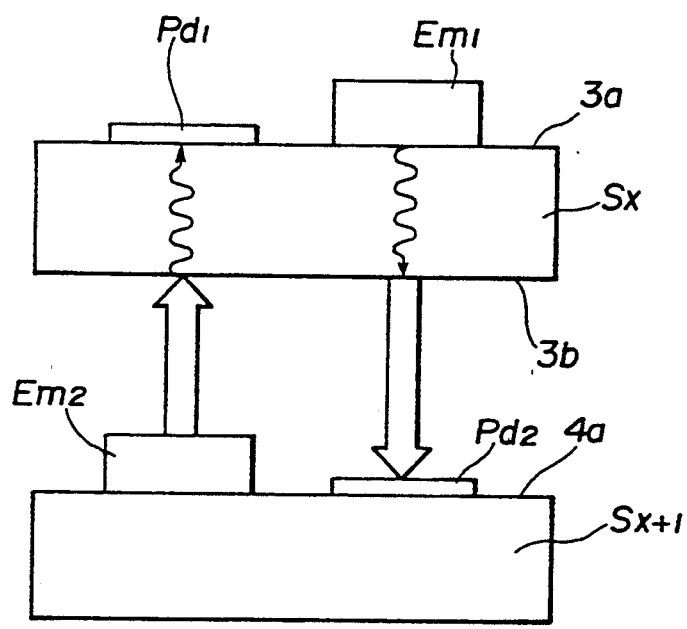
FIG. 4 is a cross-sectional view showing essential parts of the three-dimensional integrated circuit device shown in FIG. 3.

FIG. 4 is a cross-sectional view showing essential parts of a pair of substrates $S_x$, $S_{x+1}$ for effecting light transmission, and shows the manner of bidirectional light transmission. These substrates $S_x$, $S_{x+1}$ have been arbitrarily taken out of the substrates $S_1$ to $S_n$. The light emitting elements $Em_1$, $Em_2$ generate the light of a wavelength capable of being traversed through the substrates $S_x$, $S_{x+1}$ to radiate the light in a direction perpendicular to the major surfaces of the substrates $S_x$, $S_{x+1}$. The light emitting elements $Em_1$, $Em_2$ are surface-emitting type laser elements. Since the substrate to be transmitted by light between the substrates $S_x$, $S_{x+1}$ is the substrate $S_x$, the light emitting element $Em_1$ emits light from a front surface 3a towards a reverse surface 3b, while the light emitting element $Em_2$ of the substrate $S_{x+1}$ emits light from a front surface 4b towards the substrate $S_x$.

The light from the light emitting element $Em_1$ of the substrate Sx is transmitted through the substrate $S_x$ so as to be received by a light receiving element $Pd_2$ formed on the front surface 4a of the substrate $S_{x+1}$. The light from the light emitting element $Em_2$ of the substrate $S_{x+1}$ reaches the reverse surface 3b of the substrate 3 so as to be transmitted from the reverse surface 3b to the front surface 3a before being received by the light receiving element $Pd_1$.

By such bidirectional light coupling, signal transmission may be effected in a manner substantially free from signal distortion, mutual intervention or transmission losses between the substrates stacked in a direction perpendicular to the major surfaces of the substrates, so that a high degree of integration and high operating speed may be realized simultaneously.

Meanwhile, the light emitting element Em may be of a construction having a resonator in a direction perpendicular to the substrate surface, and a mirror inclined 45° relative to the substrate or a hologram lens. It is only necessary for the light emitting direction of the light emitting element Em to be a direction of transmission through the substrate and the light from the light emitting element Em may be emitted obliquely from the major surface instead of in a direction at right angles to the major surface.

Besides, the region I for the light emitting element Em and the light receiving element Pd may also be formed at plural positions on each substrate, instead of being formed at a single site on each of the substrates $S_1$ to $S_n$.

Second Embodiment

The present embodiment makes use of a GaAs substrate and represents a more concrete example than the preceding first embodiment.

Figure 5:
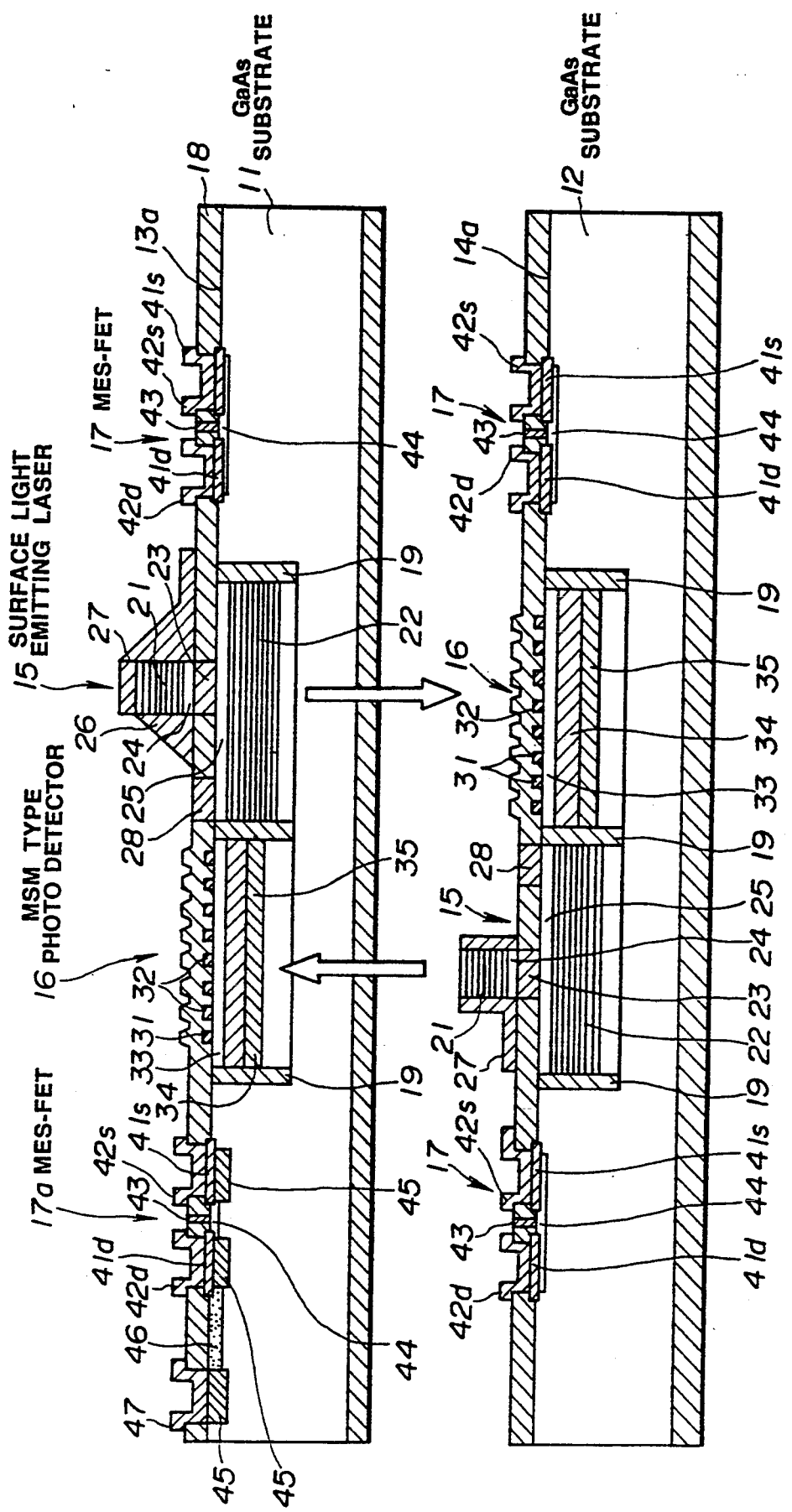
FIG. 5 is a cross-sectional view showing essential parts of a three-dimensional integrated circuit device according to a second embodiment of the present invention.

FIG. 5 shows a basic structure of the present second embodiment. A pair of GaAs substrates 11, 12, which are compound semiconductor substrates, are stacked in a direction perpendicular to the major surface of the substrate. Surface emitting laser devices 15, as light emitting elements, MSM type photodetectors 16, as light receiving elements and MES-FETs 17, as active electronic elements are formed on each of the front surfaces 13a, 14a of the GaAs substrates 11, 12.

The surface emitting laser device 15 is a DBR surface light-emitting laser device having a pair of quarter wave semiconductor multi-layer reflective films 21, 22 within the substrate and on the upper surface of the substrate, and an $In_xGa_{1-x}As$ distortion quantum well active layer 23 responsible for light emission. The $In_xGa_{1-x}As$ distortion quantum well active layer 23 is sandwiched between a p-type clad layer 24 and an n-type clad layer 25 which are arranged in contact with the $In_xGa_{1-x}As$ distortion quantum well active layer 23.

If the active layer is $In_{0.2}Ga_{0.8}As$/GaAs distortion quantum well, the surface light-emitting laser device 15 has an oscillation wavelength of $98n$ nm. It is the relative magnitude of the reflectance of two semiconductor multi-layer reflective films 21, 22 that govern the laser light outputting direction, with the laser light being emitted towards the semiconductor multi-layer reflective film having a lower reflectance, Thus, the surface light-emitting laser device 15 of the GaAs substrate 11 is higher in reflectance on the side of the semiconductor multi-layer reflective film 21, while the surface light-emitting laser device 15 of the GaAs substrate 12 is higher in reflectance on the side of the semiconductor multi-layer reflective film 22. A dielectric film 26, such as of polyimide, is formed around the semiconductor multi-layer reflective film 21 of the surface light-emitting laser device 15 of the GaAs substrate 11 . Electrodes 27, 28 are connected to each of the surface light-emitting laser devices 15.

The MSM type photodetectors 16 are light receiving elements for absorbing the light transmitted through the GaAs substrate for converting the absorbed light into electrical signals, and are formed at the positions on the surfaces 13a, 14a of the substrates 11, 12 in registration with the surface light-emitting laser devices 15 of the substrates 12, 11, respectively. Each of the MSM type photodetectors 16 is so designed that a semiconductor layer acting as a light absorbing layer is interposed between a pair of metal electrodes 31, 32 for detecting the light by on photoelectric conversion at the light absorbing layer.

The structure of the MSM type photodetector 16 is explained. Comb-shaped or meandering paired electrodes 31, 32 are deposited on the front surfaces 13a, 14a of the substrates 11, 12 and, below these electrodes there are formed a cap layer 33, a light absorbing layer 34 and a buffer layer 35, as semiconductor layers.

Figure 6:
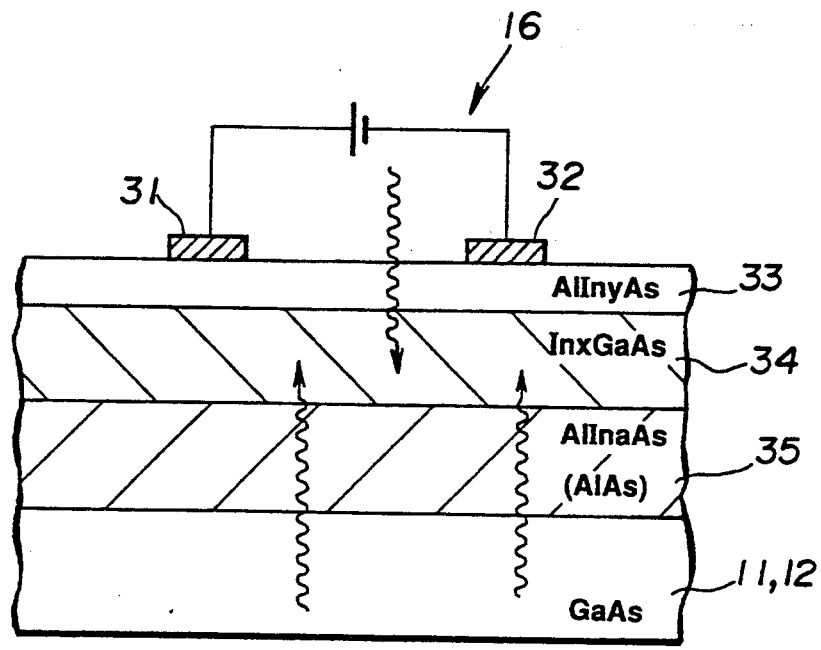
FIG. 6 cross-sectional view showing an example of a light receiving element in the second embodiment.

Referring to FIG. 6, showing an enlarged cross-sectional view of the MSM type photodetector 16 the cap layer 33, on which the metal electrodes 31, 32 are deposited, are formed as an $AlIn_yAs$ layer, while the light absorbing layer 34 arranged therebelow for generating electron-hole pairs is formed as an $In_xGaAs$ layer, where $0 \leq X \leq 1$. By forming the light absorbing layer 34 by the $In_xGaAs$ layer, the photodetector 16 exhibits sensitivity to light of the wavelength of not less than 0.9 μm transmitted through the GaAs substrate and the wavelength of the light exhibiting reception sensitivity may be adjusted depending on the value of x. The buffer layer 35 formed by an $AlIn_aAs$ layer, where $0 \leq a \leq x$, is arranged below the light absorbing layer 34. The buffer layer 35 plays the role of relaxing the lattice constant of the GaAs substrates 11, 12, with respect to the light absorbing layer 34, and is arranged as a grating layer whose crystal mixing ratio is changed gradually. The region of the buffer layer 35 near the contact surface thereof with the GaAs substrates 11, 12 is an AlAs layer, where the ratio value a of the $AlIn_aAs$ layer is zero (a=0). The region of the buffer layer 35 near the contact surface thereof with the light absorbing layer 34 is an $AlIn_xAs$ layer, where the ratio value a of the $AlIn_aAs$ layer is x (a=x), and has a lattice constant substantially equal to that of the light absorbing layer 34.

Figure 7:
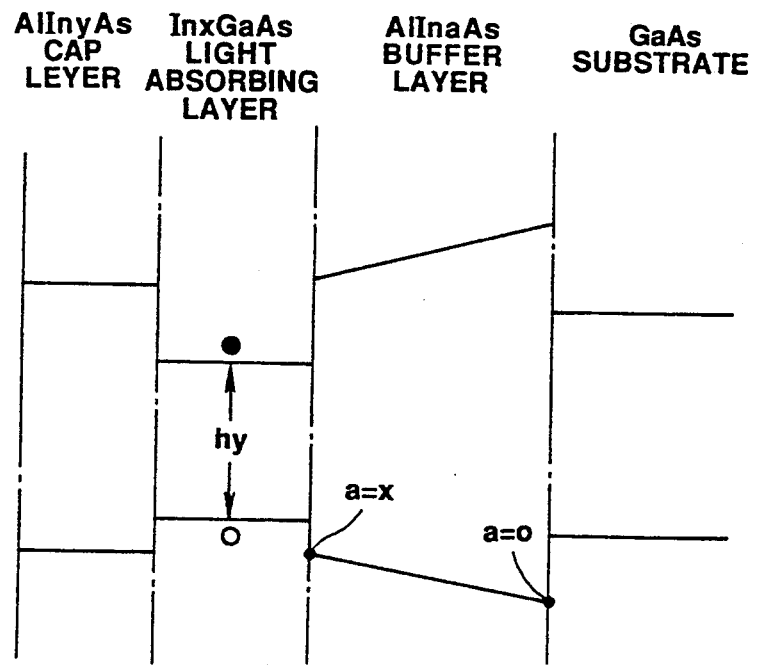
FIG. 7 is an energy band diagram along a cross-sectional plane of the light receiving element of the second embodiment taken along a direction perpendicular to a major surface of the substrate.

Referring to FIG. 7, which is an energy band diagram of the MSM type photodetector 16, the cap layer 33 is of a wide gap than the light absorbing layer 34, which light absorbing layer 34 is of a narrower gap than the buffer layer 35 or the GaAs substrates 11, 12. Thus, the light absorbing layer 34 is able to transmit light of a longer wavelength than the remaining layers or the substrates. Above all, the light transmitted through the GaAs substrates 11, 12 may be absorbed by the light absorbing layer 34. The buffer layer 35 is of an increasing gap width towards the substrates 11, 12, which is favorable from the aspect of sensitivity efficiency.

By reason of the above-described energy band structure, it becomes possible to produce electrical charges by photoelectric conversion in the light absorbing layer 34 of the light transmitted through the GaAs substrates 11, 12, similarly to the light from the surface.

Figure 8:
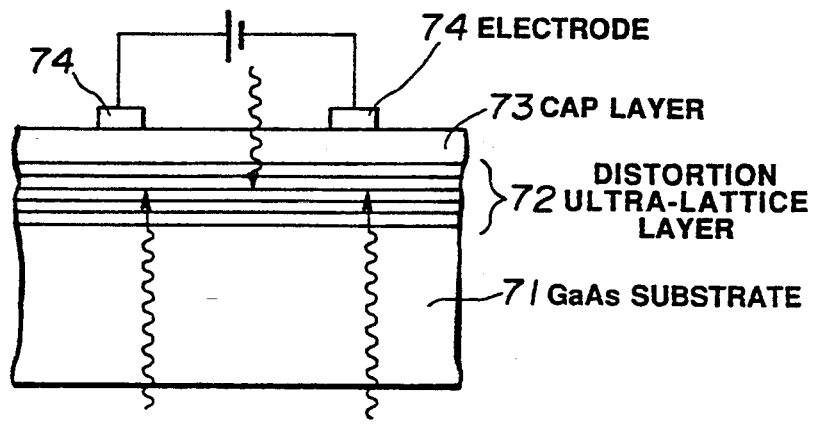
FIG. 8 is a cross-sectional view showing another example of the light receiving element employing a distortion lattice layer in the second embodiment.

Referring to FIG. 8, showing a modification of the MSM photodetector 16 shown in FIG. 6, the light absorbing layer is of a super lattice structure. That is, the MSM type photodetector shown in FIG. 8 may be built into the GaAs substrate 11 of FIG. 5 in place of the MSM type photodetctor 16 of FIG. 6.

Referring to FIG. 8, a distortion super lattice layer 72 formed by a GaAs/InGaAs layer is formed on a GaAs substrate 71, and a cap layer 73 formed by a GaAs layer is formed on the distortion super lattice layer 72. Electrodes 74, 74 are deposited on the front surface of the cap layer 73.

The electrodes 74, 74 are designed to produce an electrical field in the distortion super lattice layer 72 and may be ohmic electrodes or Schottky electrodes. The electrodes 74, 74 may be paired diagonal type electrodes or of a comb-shaped pattern. The cap layer 73, formed by an undoped GaAs layer, may be formed by an $Al_yGaAs$ layer with a wider band gap to inhibit the dark current. The cap layer 73 itself may also be omitted. The distortion super lattice layer 72 has an $In_xGaAs$ layer having a band gap narrower than that of the substrate. It is in this $In_xGaAs$ layer that the light of a wavelength of the order of 0.9 to 1.0 μm transmitted through the substrate is absorbed. Of course, the light from the reverse side of the substrate may be absorbed by the $In_xGaAs$ distortion layer similarly to the light from the front surface of the substrate.

Figure 9:
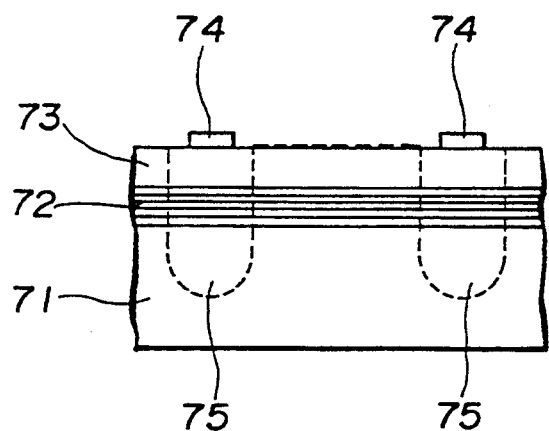
FIG. 9 is a cross-sectional view showing still another example of the light receiving element in the second embodiment.

Referring to FIG. 9, showing a modification of the MSM type photodetector shown in FIG. 8, low resistance regions 75, 75 are added to the structure of FIG. 8 because the electrical resistance becomes higher directly below the electrodes 74, 74 with the structure shown in FIG. 8. These low resistance regions 75, 75 are produced by ion implantation of n-type or p-type impurities followed by heat treatment. These low resistance regions 75, 75 are formed through the distortion super lattice layer 72, whether the impurities are of the n-type or the n-type.

The MES-FET shown in FIG. 5 will now be explained. The MES-FET 17 is formed on each of the surfaces 13a, 14a of the GaAs substrates 11, 12, and ohmic metal layers 41s, 41d for making ohmic contact are formed at a distance from each other below a source electrode 42s and a drain electrode 42d, respectively. A channel layer 44 consisting in a low concentration impurity diffusion region is formed between these ohmic metal layers 41s, 41d. A Schottky gate electrode 43 for producing a depletion layer is formed with an extremely small gate length on the upper surface of the channel region 44. Meanwhile, an insulating layer with a non-reflective coating 18 for efficient light incidence to the light receiving element as later explained may be used simultaneously as a passivation film provided below the sidewall of the Schottky gate electrode 43, source electrode 42s or drain electrode 42d outside the contact hole.

One of the MES-FETs 17a of the GaAs substrate 11 is connected to a resistance layer 46 formed by a low concentration impurity diffusion region formed on the upper surface of the GaAs substrate 11. An $n^+$ type contact layer 45 is formed below the ohmic metal layers 41s, 41d of the MES-FET 17a, with the drain side contact layer 45 being connected to the end of the resistance layer 46. The one end of the resistance layer 46 is connected via the contact layer 45 to an electrode 47, while the other end of the resistance layer 46 is connected via the contact layer 45 to drain electrode 45a.

Figure 10:
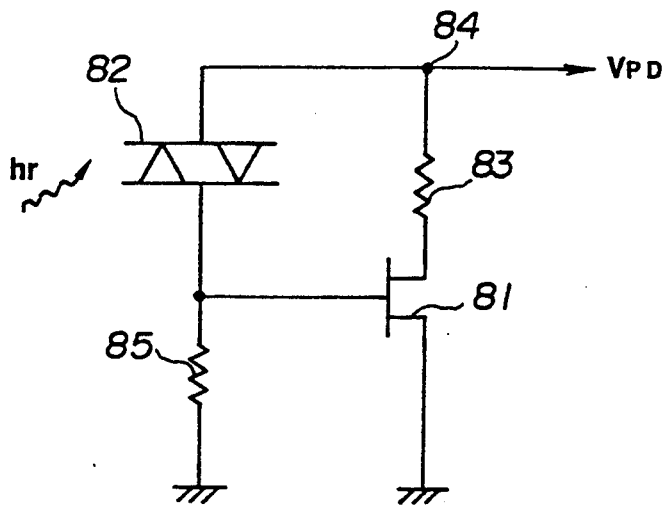
FIG. 10 is a circuit diagram showing an example of a driving circuit of the light receiving element of the second embodiment.
Figure 11:
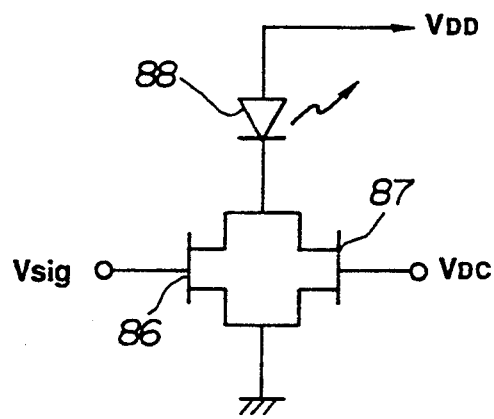
FIG. 11 is a circuit diagram showing an example of a driving circuit of a light emitting element of the second embodiment.

FIGS. 10 and 11 show an example of a driving circuit. Referring first to FIG. 10, showing an example of a driving circuit for the MSM type photodetector as a light receiving element, an MES-FET 81 has its drain connected via a resistor 83 to an output node 84. An MSM type photodetector 82 is connected across the gate of the MES-FET 81 and the output node 84, with the gate of the MES-FET 81 being grounded via a resistor 85. The MES-FET 81 has its drain connected to the resistor 83 in the presently by described circuit, so that the structure of the MES-FET 17a shown in FIG. 5 is efficient in view of layout.

Referring to FIG. 11 showing an example of a driving circuit for a surface light-emitting laser device as a light-emitting device, a surface light-emitting laser device 88, having its one end connected to a power source voltage $V_{DD}$, has its other end connected to a common drain of a pair of MES-FETs 86, 87. These paired MES-FETs 86, 87 have their sources connected in common and a signal voltage $V_{sig}$ is supplied to the gate of one of the MES-FETs 87, while a control electrode $V_{DC}$ is supplied to the gate of the other of the MES-FETs 87. With the above-described driving circuit, a potential difference is applied across both ends of the surface light-emitting laser device 88 when the signal voltage $V_{sig}$ is at a high logical level to produce the light of a wavelength capable of being transmitted through the substrate.

Referring again to FIG. 5, showing the construction of a three-dimensional optical-electronic integrated circuit device, non-reflective insulating films 18 are coated on front surfaces 13a, 14a and reverse surfaces 13b, 14b of the GaAs substrates 11, 12. These non-reflective insulating films 18 function as protective films for the exposed surfaces 13a, 14a of the GaAs substrates 11, 12, while being capable of satisfactorily transmitting the light because of its non-reflective properties, so that the films 18 are thought to be convenient for light coupling between the substrates. A coated type insulating film 19 is embedded in a groove in the substrate for isolating the MSM type photodetector 16 and the surface light-emitting laser device 15 which are formed in adjacent to each other.

With the above-described three-dimensional optical-electronic integrated circuit device of the present embodiment, the light emitted by the surface light-emitting laser device 15 has a wavelength longer than that at an absorption end of GaAs, so that the light transmitted through the GaAs substrate 11 is received by the MSM type photodetector 16. Thus, the signal transmission between the substrates is an ideal one which remains unaffected by signal distortion, transmission losses, mutual intervention or transmission delay. Because of the light coupling, a higher operating speed may be achieved, so that an extremely high operating speed of the overall system may be achieved by applying the three-dimensional optical-electronic integrated circuit device of the present embodiment to a system portion in need of high operating speed such as a connecting region between a micro-processor and a cache memory to realize a significantly increased operating speed of the overall system.

Besides, the transmission channel is the substrate itself, so that transmission losses such as those caused with an optical fiber may be eliminated. Thus, the laser power is not lost and the transmission channel of light coupling may be diminished by time multiplexing to realize a low power consumption.

The circuit device of the present embodiment may be thought of as a conventional high integration LSI circuit which is subdivided into plural functional blocks and mini-blocks by a three-dimensional array and in which a large number of block-by-block substrates are stacked one upon the other. Thus, the substrates found to be rejectable are discarded before the stage of stacking the substrates in a three-dimensional array for improving the rate of acceptable substrates.

Although light coupling is achieved between GaAs substrates in the present three-dimensional optical-electronic integrated circuit device of the present embodiment, a silicon substrate or an InP substrate may also be used in combination with the GaAS substrate, while the GaAs IC may be combined with IC of ECL or CMOS having different logical levels.

Figure 12:
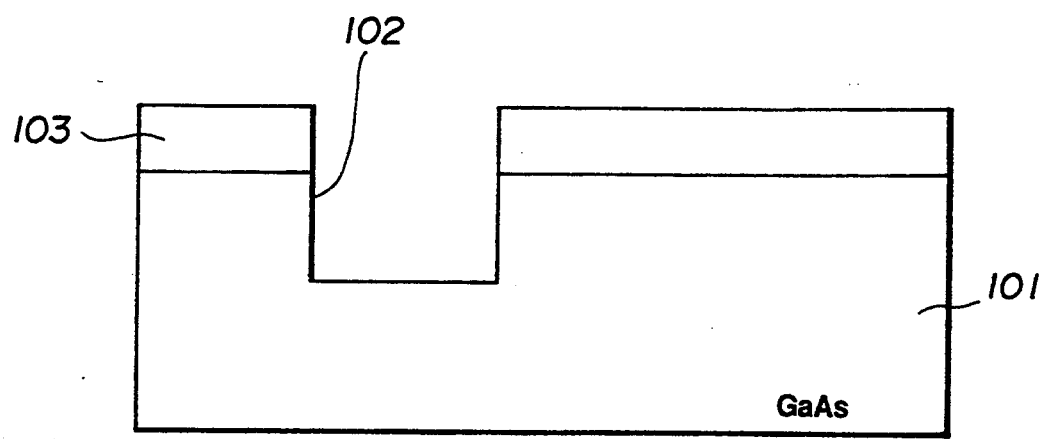
FIG. 12 is a cross-sectional view showing a method for producing the three-dimensional light electron integrated circuit device according to the second embodiment, up to a step of forming a recess.
Figure 13:
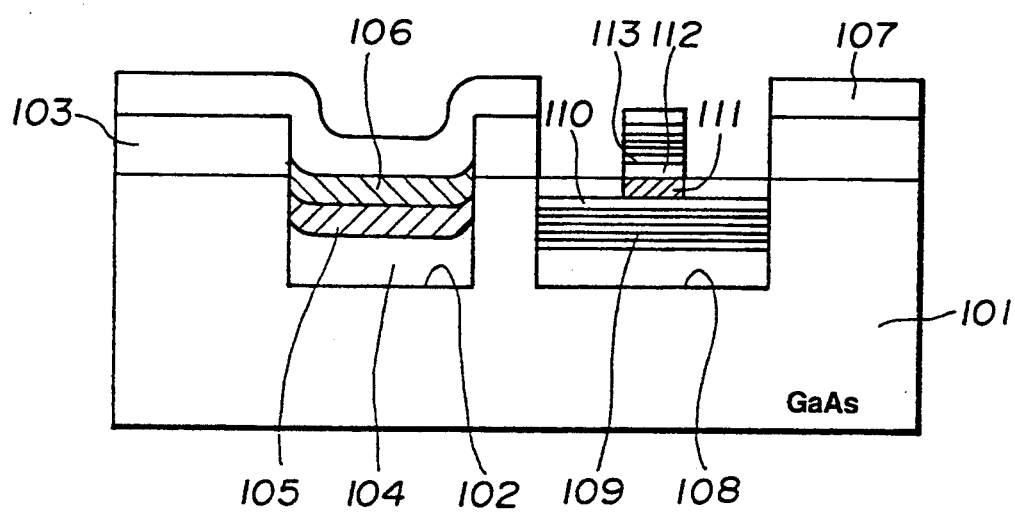
FIG. 13 is a cross-sectional view showing the method for producing the three-dimensional light electron integrated circuit device according to the second embodiment, up to a step of forming a semiconductor multi-layer reflective film.
Figure 14:
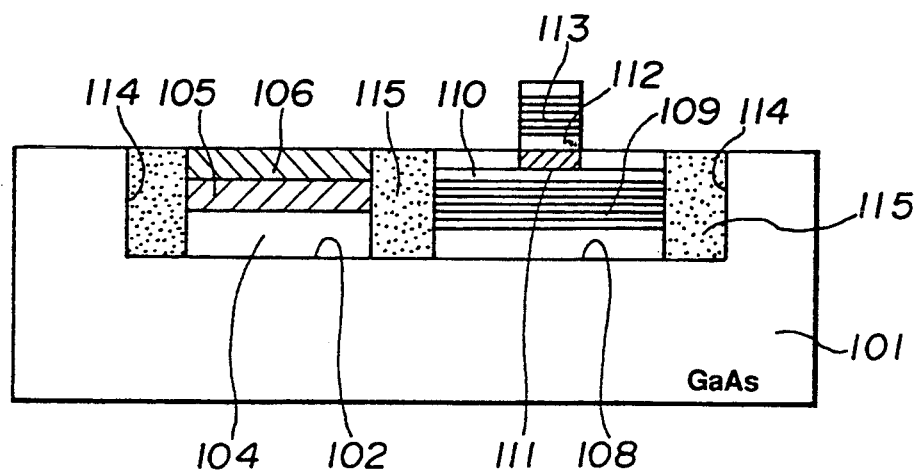
FIG. 14 is a cross-sectional view showing the method for producing the three-dimensional light electron integrated circuit device according to the second embodiment, up to a step of forming a coated type insulating film.

Referring to FIGS. 12 to 14, the method for producing a three-dimensional optical-electronic integrated circuit device of the present embodiment will be explained briefly.

A channel layer, a contact layer and a load resistor layer of a MES-FET are first formed on a GaAs substrate. These layers are formed by selective ion implantation of n-type dopants, such as Si, followed by an activating treatment by annealing.

Then, as shown in FIG. 12, a recess 102 is formed in the region of the GaAs substrate 101 in which an MSM photodetector as a light receiving element is to be formed. The silicon oxide film 103 may be used as a mask in forming the recess 102. A buffer layer 104, a light absorbing layer 105 and a cap layer 105 are then selectively grown, within the recess 102 by an MOCVD method or an MBE method. The layer of the compound semiconductor laser, such as a buffer layer, is partially deposited on the upper surface of the silicon oxide layer 104 outside the recess 102. Such deposited compound semiconductor layer may be eliminated by photolithographic resist patterning.

A silicon oxide layer 107 may again be deposited, and an opening is formed in the region of the silicon oxide film 107 in which to form a light emitting element. A recess 108 is formed using the silicon oxide film 107 as a mask.

After the formation of the recess 108, a lower semiconductor multi-layer reflective film 109, an n-type clad layer 110, an InGaAs distortion quantum well active layer 111, a p-type clad layer 112 and an upper semiconductor multi-layer reflective film 113 are selectively deposited step by step within the recess 108. After formation of these layers which make up the surface light-emitting laser device, the polycrystal compound semiconductor layer on the silicon oxide film 107 is removed. The layers beginning from the InGaAs distortion quantum well active layer 111 to the upper semiconductor multi-layer reflecting film 113 are etched to provide a perpendicular resonator, as shown in FIG. 13.

The silicon oxide layers 107, 103 are then removed and a groove 114 is formed around the light receiving elements and the light emitting elements for achieving element-to-element isolation, and a coated type insulating film 115 is embedded within the groove 114. The coated type insulating film 115 is then cured to complete the element-to-element isolation.

After formation of the insulating film 115, an ohmic metal layer is formed by the step-by-step process of vacuum deposition of an AuGe/Ni layer, lift-off and alloying. A p-type electrode of the laser devices formed as a Ti/Pt/Au layer by a similar lift-off method. These electrodes may be formed not only for the light receiving elements or the light emitting device, but also for the MES-FETs on the same substrate or with formation of interconnection.

Third Embodiment

Figure 15:
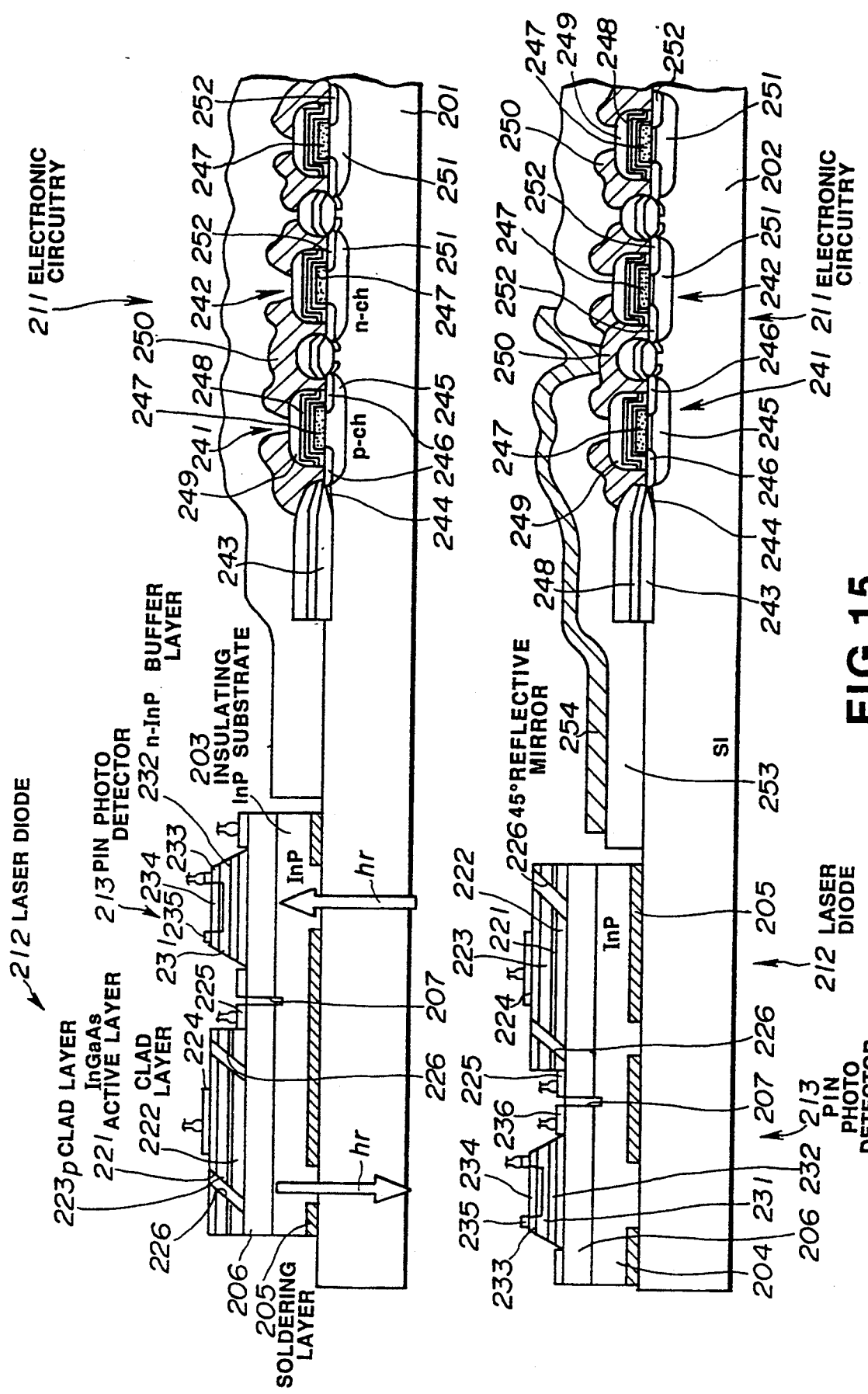
FIG. 15 is a cross-sectional view showing essential parts of a three-dimensional integrated circuit device according to a third embodiment of the present invention.

The present embodiment is an embodiment in which each substrate is formed by an InP substrate attached to a silicon substrate by way of achieving a hybrid structure in which a CMOS-LSI circuit is formed on a silicon substrate and light receiving elements as well as the light emitting elements are formed on the InP substrate while signal transmission between the substrates is effected by light transmission. In FIG. 15, only two of a large number of substrates are discussed out for simplicity of explanation and there is no particular 1 imitation to the number of stacked substrates.

Figure 16:
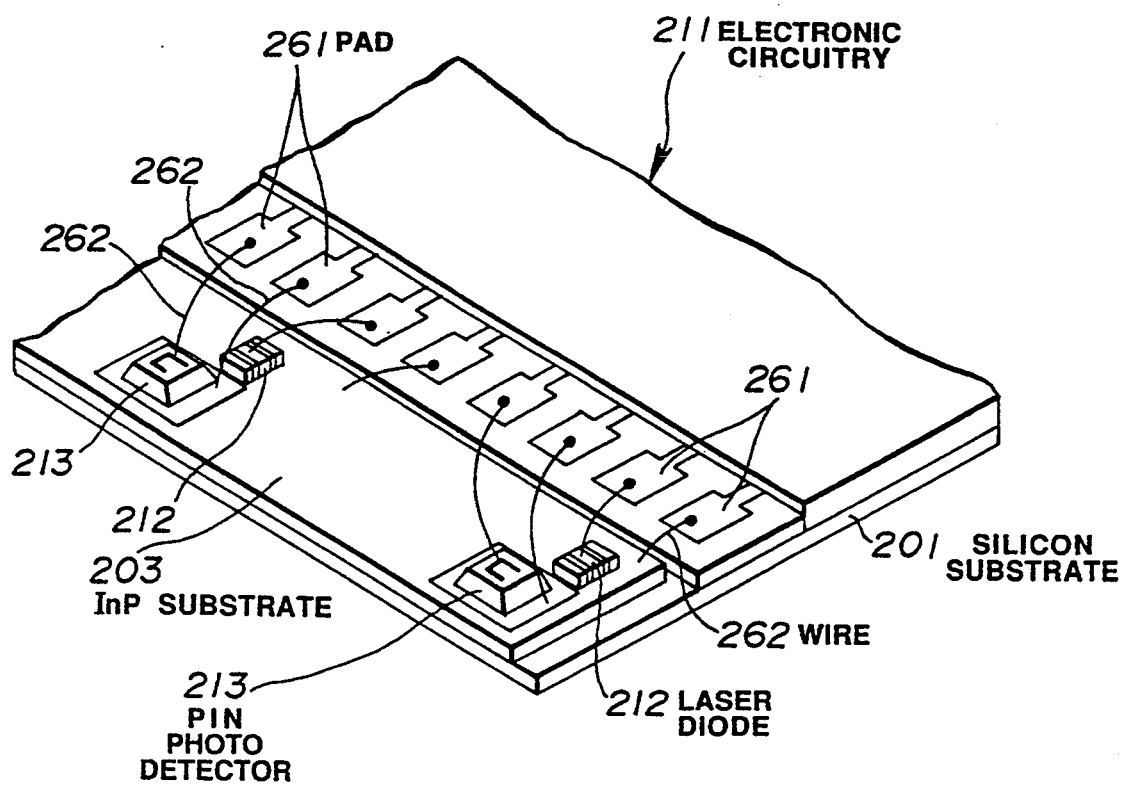
FIG. 16 is a perspective view showing the manner of interconnection between an InP substrate and a silicon substrate in the third embodiment of the present invention.

In the present embodiment, shown in FIG. 16, an electronic circuitry 211 is formed on each of silicon substrates 201, 202, while a laser diode 212 as a light emitting element and a PIN photodetector 213 as a light receiving element are formed on insulating InP substrates 203, 204 which are compound semiconductor substrates. The InP substrates 203, 204 are stacked on and unified to the silicon substrates 201, 202 via a soldering layer 205. Thus the substrates are each of a hybrid structure made up of the silicon substrates 201, 202 and the InP substrates 203, 204. With such construction, optical transmission between the substrates is effected not only through the InP substrates 203, 204 but also through the silicon substrates 201, 202. The wavelength at an end of the absorption spectrum of InP is slightly more than 0.9 $\mu$m, and that at an end of the absorption spectrum of silicon is slightly more than 1.1 $\mu$m. Thus, the light having a wavelength not less than that at the end of the absorption spectrum of silicon is required as the light transmitted through both of the substrates. In the present embodiment, the light of a wavelength in a range of 1.3 || m is radiated from a laser diode 212. An n+ type InP buffer layer 206 is deposited on an upper part of each of the InP substrates 203, 204.

The laser diode 212 radiates the light of a wavelength capable of being transmitted through both the silicon substrate and the InP substrate. The laser diode 212 is a laser device having a Fabry-Perot horizontal resonator employing an InGaAs active layer 221. Thus, an n-type clad layer 222 is formed below an InGaAs active layer 221, and a p-type clad layer 223 is formed above the InGaAs layer 221. The laser diode 212 is provided with 45° reflective mirrors 206, 206 for radiating a laser beam in a direction perpendicular to the substrate surface. Thus, the laser beam directed horizontally with respect to the substrate surface from the InGaAsP active layer 221 is reflected by the 45° reflective mi props 206, 206 in a direction perpendicular to the substrate surface. Electrodes 224, 225 are connected to the p and n sides of the laser diode 212, respectively.

The laser diode 212 may be a refractive index waveguide type, gain waveguide type, a distributed feedback type or a rib waveguide type device. It may also be a surface light-emitting laser device having a DBR reflective mirror, as in the second embodiment.

A PIN photodetector 213 is the light receiving element exhibiting sensitivity to a laser beam of a wavelength in the range of 1.3 $\mu$m transmitted through both the silicon substrate and the InP substrate. In the present embodiment, the PIN photodetector 213 has a mesa type structure formed on the InP substrate. A buffer layer 232 formed by an n-type InP layer is formed below an InGaAs layer as a light absorbing layer 231, while a window layer 233 formed of InGaAsP and a p+ type diffusion layer 234 are formed above the light absorbing layer 231. An electrode layer 235 is formed on the surface of the window layer 233 and an electrode 236 is formed in a lower layer of the n-type InP layer. Although the InGaAs layer is used as the light absorbing layer 231, layers of Ge, GaAs, AlGaAsSb or InGaSb may also be used in place of the InGaAs layer as a layer exhibiting sensitivity in a range centered around the wavelength of 3 $\mu$m. Of course, the InGaAsP layer may be used as a light absorbing layer.

It is noted that the PIN photodetector 213 and the laser diode 212 are formed facing each other in a direction perpendicular to the substrate surface. That is, the 45° reflective mirror 26 of the laser diode 212 and the light absorbing layer 21 of the PIN photodetector 213 are arrayed on one and the same straight line perpendicular to the substrate surface. Besides, the soldering layer 205 for interconnecting the InP substrate and the silicon substrate is not provided in the light transmission channel. Thus, the light radiated from he laser diode 212 is transmitted through the InP substrate and the silicon substrate so as to be positively received by the PIN photodetector 213.

For isolating the PIN photodetector 213 and the laser diode 212, both formed on the same InP substrates 203, 204, from each other, a trench-shaped isolating groove 207 is formed in a region between these devices 212, 213.

An electronic circuit 211 formed on each of the silicon substrates 201, 202 will now be explained. The electronic circuit 211 is of a CMOS structure having a p-channel pMOS transistor 241 and an n-channel nMOS transistor 242 formed on the surfaces of the silicon substrates 201, 202. The pMOS transistor 241 and the n-MOS transistor 242 are isolated from each other by having their active regions coated by a field oxide film 243 of a thick silicon oxide film. Meanwhile, the field oxide film 243 for isolation may be formed in accordance with an isolation method other than LOCOS. A channel stop region 244 is also formed below the field oxide film 243.

The electronic circuitry 211 functions as a driving circuit for a PIN photodetector 213 or a laser diode 212 and may be designed as a circuit having the functions of, for example, a memory or a processing circuit.

The MOS transistors are explained briefly hereinafter. The pMOS transistor 241 has p-type impurity regions 246, 246, formed on the surfaces of an n-type region 245 surrounded by a field oxide film 243, as source and drain regions, respectively. The region between the p-type impurity diffusion regions 246, 246 is a channel region, on which a gate electrode 247 formed of polysilicon is formed via a gate oxide film. The gate electrode 247 of polysilicon is coated by an interlayer insulating film 248 and a fellow film 249. An aluminum interconnection layer 250, which is an upper first layer of the fellow layer 249, is connected to a contact region in which the p-type impurity regions 246, 246 are exposed.

The n-MOS transistor 242 has paired n-type impurity regions 252, 252, formed on the p-type well region 251, as the source and the drain regions, and a gate electrode 247 of polysilicon is formed in a channel region between the source and drain regions. The gate electrode 247 is coated with the interlayer insulating film 248 and the fellow film 249, as in the case of the pMOS transistor 241, with the first aluminum layer 250 being connected via a contact hole to the n-type impurity regions 252, 252.

The electronic circuit 211, on which the pMOS transistor 241 and the nMOS transistor 242 are formed, is also provided with an interlayer insulating film 253 and with a second aluminum layer 254 for interconnection between the devices.

Since the three-dimensional optical electronic integrated circuit device of the present embodiment is of a hybrid structure comprised of InP substrates 203, 204 and the silicon substrates 201, 202, wire bonding is used for making electrical connection between the two substrates. FIG. 15 shows the state in which the devices on the InP substrate 203 are interconnected by a wire 206 with a pad 261 of the silicon substrate 201. That is, the pad 261 is formed on the silicon substrate 201 as a terminal for inputting and outputting signals for driving or amplification from the electronic circuity 211 on the silicon substrate 201. The wire 262 having its one end bonded to the pad 261 has its other end bonded to electrodes of the PIN photodetector 13 or electrodes of the laser diode 212.

Although wire bonding is used in the present embodiment for electrical connection between the InP substrates 203, 204 and the silicon substrates 201, 202, a flipflop packaging method, for example, may also be employed.

With the present third embodiment of the three-dimensional optical-electronic integrated circuit device, the PIN photodetector 213 and the laser diode 212, formed on the InP substrates 203, 204, are used for light signal transmission of the wavelength range centered around the wavelength of 1.3 $\mu$m. Thus, even although the present embodiment is a hybrid structure of InP substrates 203, 204 and silicon substrates 201, 202, high speed low loss transmission which takes advantage of light coupling may be realized to permit high a degree of integration by three-dimensional arrangements and transmissions exceeding the logical level.

On the other hand, since the silicon substrate mainly used in a variety of semiconductor ICs may be directly employed, the present embodiment may have a wide field of application and usage.

Fourth Embodiment

Figure 17:
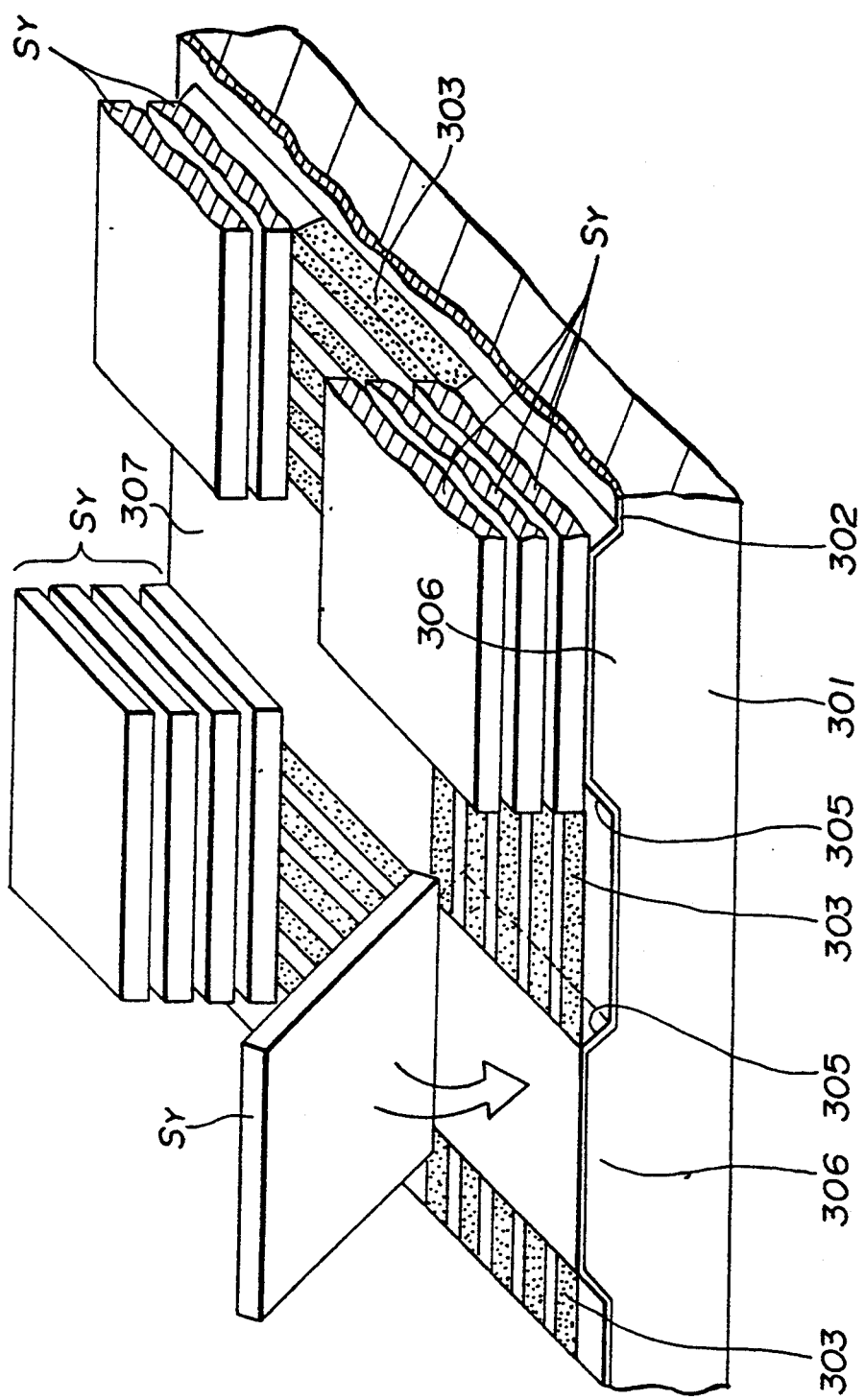
FIG. 17 is a perspective view showing a three-dimensional light electron integrated circuit according to a fourth embodiment of the present invention.

In FIG. 17, an optical-electronic integrated circuit device according to a fourth embodiment of the present invention is illustrated in perspective. A plurality of optical IC chips $S_y$ are arrayed and packaged on the surface of a planar optical interconnection substrate 301, and waveguide channels 303 are formed between neighboring IC chips on the substrate 301. These IC chips correspond to the substrates in the first to third embodiments. In the present embodiment, the term "chips" is used for discrimination from substrates for optical interconnection.

The optical interconnection substrate 301 is a silicon substrate the surface of which is previously processed by a method hereinafter explained. Thus, the substrate has plural raised sections 306 at the positions on which to provide the optical-electronic IC chips $S_y$. The raised sections 306 are contiguous to the major surface of the substrate by an inclined peripheral region 305 inclined 45° with respect to the substrate surface. A reflective film 302 is formed to a predetermined film thickness on the entire surface of the substrate 301 inclusive of the inclined peripheral region 305. A silicon oxide film 307 is formed on the surface of the substrate 301 except the raised sections 306 and light waveguide channels 303 are formed on the portions of the silicon oxide film 307 defined between the neighboring raised sections 306.

The reflective film 302 is a metal film of aluminum, gold or other metals for enhancing reflectance of the inclined regions 305 by metallic reflection. The light of a wavelength capable of being transmitted through a silicon material may be reflected easily. The reflective film 302 is formed of metal and hence is superior in electrical conductivity. Above all, the reflective film 302 is able to function as interconnections for supplying an electrical power to the optical-electronic IC chip $S_y$.

The light waveguide channels 303 serve as light paths for light transmission between the raised sections. Since the light channels are formed in the silicon oxide film 307 deposited on the surface of the optical interconnection base plate 301, the light channels run along the substrate surface. A plurality of such light waveguide channels 303 are continuously formed for being extended from one inclined region to another for effecting bi-directional transmission and transmission of different signals. These light wave guide channels 303 my be formed by forming high refractive index regions by ion implantation e.g. of protons.

Figure 18:
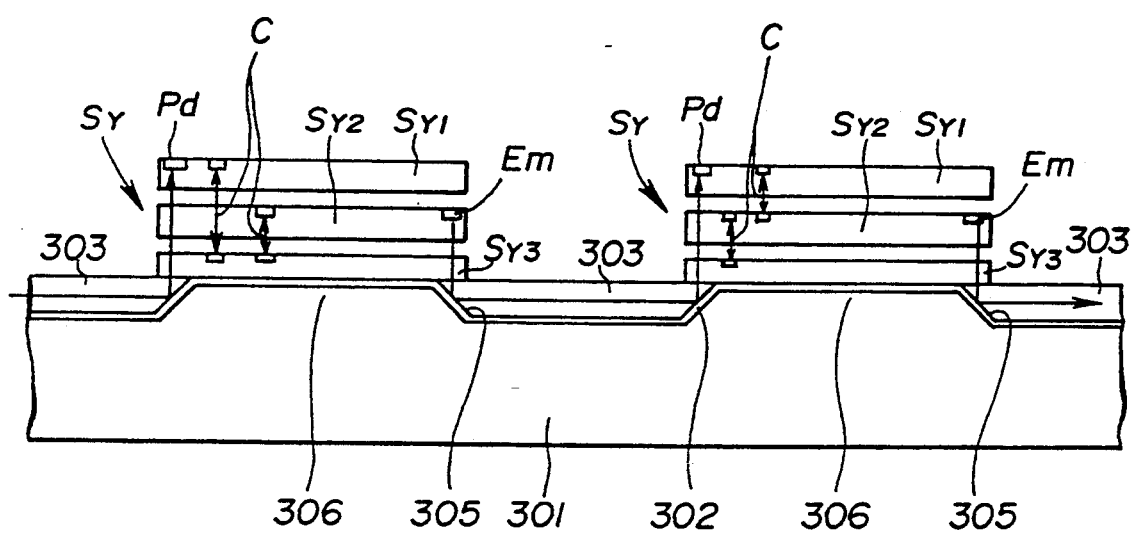
FIG. 18 is a cross-sectional view showing the manner of light coupling between light electron IC chips in the fourth embodiment.

FIG. 18 shows the manner of light coupling between optical-electronic IC chips $S_y$. The optical interconnection base plate 301 has raised sections 306 having inclined lateral regions 305. The reflective film 302 is formed on the surface of the inclined peripheral regions 305, and light waveguide channels 303 are formed in recesses around the raised sections 306.

The optical-electronic IC chips $S_y$ are chips $S_y1$, $S_y2$ and $S_y3$. The light receiving element Pd and the light emitting element Em are provided in one of these chips. The light receiving element and the light emitting element are provided at positions horizontally aligned with the inclined peripheral regions 305 of the optical interconnection base plate 301. The light from the light emitting element Em is passed through the chips $S_y2$ and $S_y3$ to reach the inclined peripheral regions 305, while the light received by the light receiving element Pd is the light transmitted through the chips $S_y1$, $S_y2$ and $S_y3$. These chips $S_y1$, $S_y2$ and $S_y3$ are optical 1 y coupled to one another as indicated by an optical transmission C.

By combining these stacked optical IC chips in a two-dimensional direction, the degree of integration may be increased further. Since the coupling in its entirety is achieved by light, signal transmission may be carried out in a manner free from mutual intervention or signal distortion.

Referring to FIGS. 19 to 23, a typical method for producing an optical-electronic integrated circuit device of the present embodiment is explained.

Figure 19:
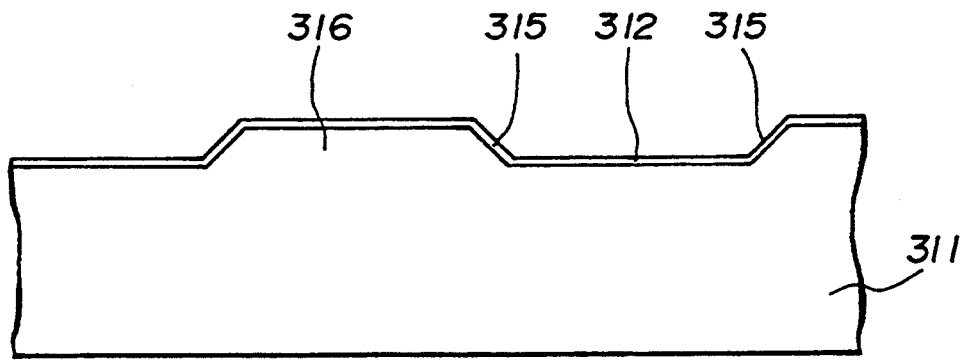
FIG. 19 is a cross-sectional view showing a method for producing the three-dimensional light electron integrated circuit device according to the fourth embodiment, up to a step of processing a substrate.

Referring first to FIG. 19, a silicon chip 311 is processed to forming a raised section 316 with an inclined peripheral region 15 on the surface of the silicon chip 311. The raised section 316 is formed by anisotropic etching, such as dry etching. The inclined peripheral region 315 is formed at an angle of 45° with respect to the major surface. A reflective film 312 is deposited on the entire surface of the silicon chip 311 formed with the raised section 316. If the reflective film 312 is an aluminum film, it may be deposited by evaporation.

Figure 20:
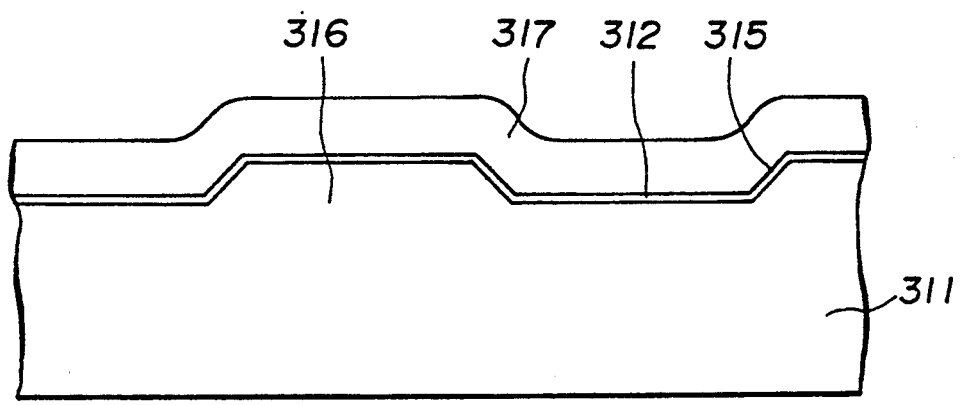
FIG. 20 is a cross-sectional view showing the method for producing the three-dimensional light electron integrated circuit device according to the fourth embodiment, up to a step of forming a silicon oxide film.

Then, as shown in FIG. 20, a silicon oxide film 317 is formed, as a layer of a material for the waveguide channel, on the entire surface of the silicon chip 311 by, for example, a CVD method. The silicon oxide film 317 is formed to a thickness such that the recess between the raised sections 316 may be filled completely with silicon oxide.

Figure 21:
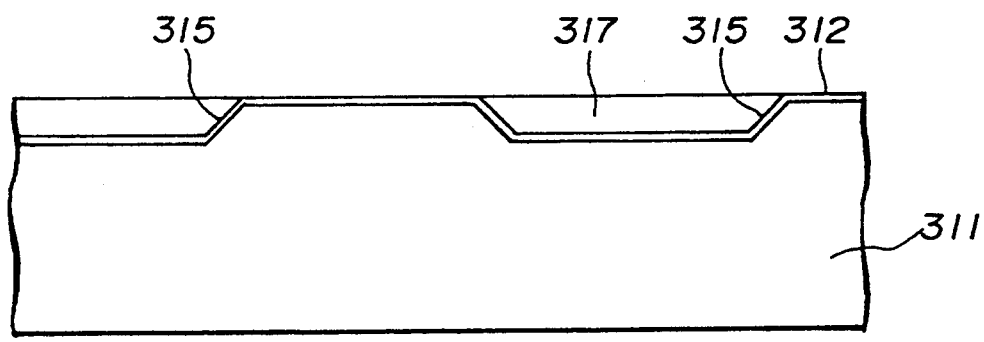
FIG. 21 is a cross-sectional view showing the method for producing the three-dimensional light electron integrated circuit device according to the fourth embodiment, up to a polishing step.

After the silicon oxide film 317 is formed to an increased thickness, the silicon oxide film 317 is reduced in thickness by, for example, mechanical polishing. That is, the silicon oxide film 317 is scraped off until the upper surface of the raised section 316 is exposed, as shown in FIG. 21. If the silicon oxide film 317 is scraped to such an extent that the reflective film 312 on the raised section 316 is not exposed, a contact hole is formed in the raised section 316 for supplying electric power.

Figure 22:
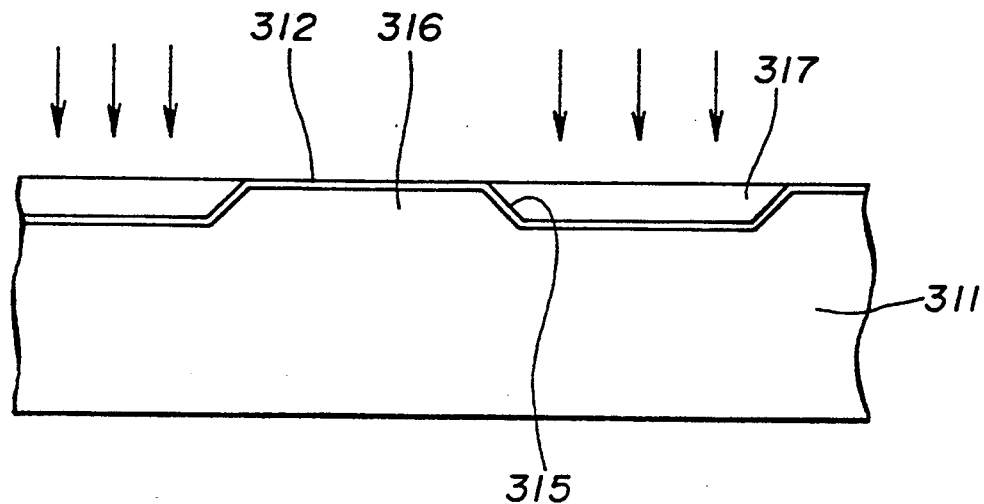
FIG. 22 is a cross-sectional view showing the method for producing the three-dimensional light electron integrated circuit device according to the fourth embodiment, up to an ion implantation step.

Then, as shown in FIG. 22, protons are implanted into the silicon oxide layer 317 for forming a high refractive index layer. The high refractive index layer is formed in such a pattern as to form parallel waveguide channels. Ion implantation is effected using a resist, not shown, as a mask.

Figure 23:
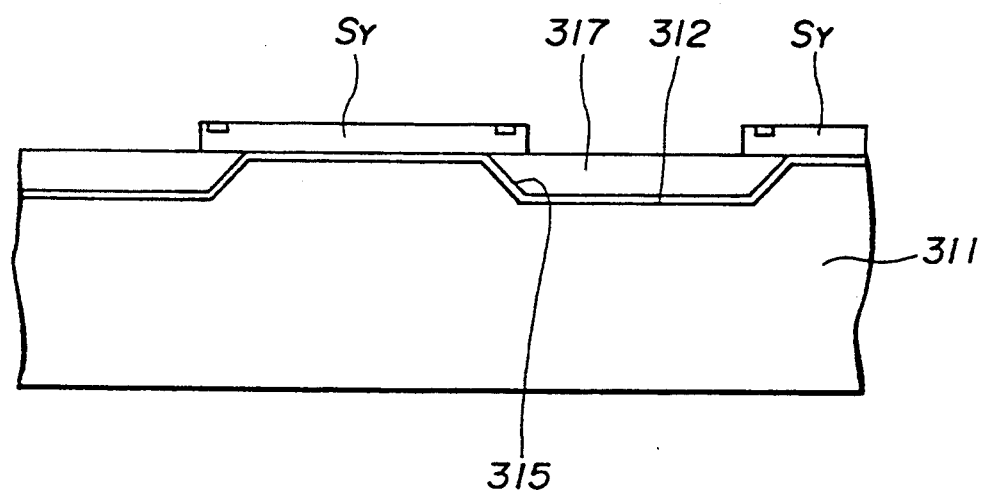
FIG. 23 is a cross-sectional view showing the method for producing the three-dimensional light electron integrated circuit device according to the fourth embodiment, up to a step of mounting an optical-electronic IC chip.

After forming the light wave guide channels in the silicon oxide layer 317, the optical-electronic IC chips $S_y$, on which the light receiving elements, the light emitting elements and the electronic circuit are previously formed, are set on the raised sections 316, as shown in FIG. 23. At this time, power supply terminals of the optical-electronic IC chips $S_y$ are connected to the reflective films 312, while the light receiving elements and the light emitting elements of the optical-electronic IC chips $S_y$ are set for being positioned on the inclined peripheral regions 315. Although other modifications and changes may be suggested by those skilled in the art, it is the intention of the inventors to embody within the patent warranted hereon all changes and modifications as reasonably and properly come within the scope of their contribution to the art.

What is claimed is:

1. An optical-electronic integrated circuit device, comprising:
   an optical interconnection base plate having a plurality of raised sections, said plurality of raised sections having sidewalls and defining a groove between said raised sections;
   semiconductor substrates on said plurality of raised sections; and
   at least one light emitting element on one of said semiconductor substrates; and
   at least one light receiving element on another of said semiconductor substrates;
   wherein said sidewalls of said raised sections have inclined surfaces, and optical signals are emitted from said light emitting element, then reflected at said inclined surfaces and received into said light receiving element through said groove between said raised sections.

2. The optical-electronic integrated circuit device as defined in claim 1, wherein said semiconductor substrates are stacked in a direction perpendicular to the major surface of said semiconductor substrates, and further comprising:
   an optical interconnection base plate arranged parallel to said semiconductor substrates, and
   a reflecting film on said inclined surfaces provided facing said light emitting element to reflect the optical signals emitted by said at least one light emitting element;
   a light waveguide channel through which the optical signals are transmitted before being reflected by said reflective film on said inclined surfaces provided facing said light receiving element so as to be incident on said light-receiving element.

3. The optical-electronic integrated circuit device, comprising:
   an optical interconnection base plate having a plurality of raised sections, said plurality of raised sections having sidewalls and defining a groove between said raised sections, said sidewalls of said raised sections having an inclined surface;
   semiconductor substrates on said plurality of raised sections, said semiconductor substrates are stacked in a direction perpendicular to the major surface of said semiconductor substrates;

at least one light emitting element on one of said semiconductor substrates operable to emit optical signals;

a light receiving element on another of said semiconductor substrates;

an optical interconnection base plate arranged parallel to said semiconductor substrates;

a reflecting film on said inclined surface provided facing said light emitting element to reflect the optical signals emitted by said at least one light emitting element; and a light waveguide channel through which the optical signals are transmitted before being reflected by said reflective film on said inclined surface provided facing said light receiving element so as to be incident on said light-receiving element;

wherein the optical signals transmitted between said at least one light emitting element on said one of said semiconductor substrates and said light receiving element on said another semiconductor substrate being coupled through said groove between said raised sections, wherein said optical interconnection base plate is formed of silicon, and wherein said light waveguide channel is formed by a silicon oxide film formed on said optical interconnection base plate.

4. The optical-electronic integrated circuit device, comprising:

an optical interconnection base plate having a plurality of raised sections, said plurality of raised sections having sidewalls and defining a groove between said raised sections, said sidewalls of said raised sections having an inclined surface;

semiconductor substrates on said plurality of raised sections, said semiconductor substrates are stacked in a direction perpendicular to the major surface of said semiconductor substrates;

at least one light emitting element on one of said semiconductor substrates operable to emit optical signals;

a light receiving element on another of said semiconductor substrates;

an optical interconnection base plate arranged parallel to said semiconductor substrates;

a reflecting film on said inclined surface provided facing said light emitting element to reflect the optical signals emitted by said at least one light emitting element; and a light waveguide channel through which the optical signals are transmitted before being reflected by said reflective film on said inclined surface provided facing said light receiving element so as to be incident on said light-receiving element;

wherein the optical signals transmitted between said at least one light emitting element on said one of said semiconductor substrates and said light receiving element on said another semiconductor substrate being coupled through said groove between said raised sections, wherein said light wave guide channels are formed in a region of a silicon oxide film having a refractive index that is higher than a refractive index of material surrounding said region.

5. The optical-electronic integrated circuit device, comprising:

an optical interconnection base plate having a plurality of raised sections, said plurality of raised sections having sidewalls and defining a groove between said raised sections, said sidewalls of said raised sections having an inclined surface;

semiconductor substrates on said plurality of raised sections, said semiconductor substrates are stacked in a direction perpendicular to the major surface of said semiconductor substrates;

at least one light emitting element on one of said semiconductor substrates operable to emit optical signals;

a light receiving element on another of said semiconductor substrates;

an optical interconnection base plate arranged parallel to said semiconductor substrates;

a reflecting film on said inclined surface provided facing said light emitting element to reflect the optical signals emitted by said at least one light emitting element; and a light waveguide channel through which the optical signals are transmitted before being reflected by said reflective film on said inclined surface provided facing said light receiving element so as to be incident on said light-receiving element;

wherein the optical signals transmitted between said at least one light emitting element on said one of said semiconductor substrates and said light receiving element on said another semiconductor substrate being coupled through said groove between said raised sections, wherein said optical interconnection base plate is formed of silicon, said inclined surface is formed by sidewall surfaces of raised sections formed on said semiconductor substrates, and wherein said light waveguide channels are formed in a silicon oxide film formed in a region defined between said raised sections.

6. The optical-electronic integrated circuit device as defined in claim 2, wherein said reflective film is formed of an electrically conductive material and is used simultaneously as an interconnection layer for said optical interconnection base plate.

* * * * *